United States Patent
Kesselring et al.

(10) Patent No.: US 10,969,422 B2
(45) Date of Patent: Apr. 6, 2021

(54) GUARD RING MONITOR

(71) Applicant: INTERNATIONAL BUSINESS MACHINES CORPORATION, Armonk, NY (US)

(72) Inventors: Grant P. Kesselring, Rochester, MN (US); James D. Strom, Rochester, MN (US); Ann Chen Wu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 15/981,175

(22) Filed: May 16, 2018

(65) Prior Publication Data

US 2019/0353697 A1 Nov. 21, 2019

(51) Int. Cl.
| | | |
|---|---|---|
| *G01R 31/26* | (2020.01) | |
| *G01R 31/28* | (2006.01) | |
| *H01L 23/58* | (2006.01) | |
| *G01R 31/00* | (2006.01) | |
| *H01L 23/522* | (2006.01) | |
| *H01L 23/528* | (2006.01) | |

(52) U.S. Cl.
CPC ....... *G01R 31/2853* (2013.01); *G01R 31/002* (2013.01); *H01L 23/528* (2013.01); *H01L 23/5223* (2013.01); *H01L 23/585* (2013.01)

(58) Field of Classification Search
CPC .............. G01R 31/2853; G01R 31/002; H01L 23/5223; H01L 23/528
USPC .................................................... 324/762.01
See application file for complete search history.

(56) References Cited

U.S. PATENT DOCUMENTS

| | | | |
|---|---|---|---|
| 6,022,791 A | 2/2000 | Cook et al. | |
| 6,366,209 B2 | 4/2002 | Dishongh et al. | |
| 7,250,821 B2 | 7/2007 | Momii et al. | |
| 8,274,080 B2 | 9/2012 | Han | |
| 8,575,723 B2 | 11/2013 | Tschmelitsch et al. | |
| 9,730,315 B1 | 8/2017 | Razaghi | |
| 2002/0167071 A1 | 11/2002 | Wang | |
| 2008/0094053 A1 | 4/2008 | Han et al. | |

(Continued)

FOREIGN PATENT DOCUMENTS

WO    2013052618 A1    4/2013

OTHER PUBLICATIONS

Salman et al., "Methodology for Placing Localized Guard Rings to Reduce Substrate Noise in Mixed-Signal Circuits", Ph.D. Research in Microelectronics and Electronics, Jun. 22-25, 2008, pp. 85-88, IEEE, Istanbul, Turkey.

*Primary Examiner* — Melissa J Koval
*Assistant Examiner* — Courtney G McDonnough
(74) *Attorney, Agent, or Firm* — Erik K. Johnson (57) ABSTRACT

An embodiment of the invention may include a method and structure for determining a failure in a guard ring of a chip. The method may include measuring a current frequency of oscillation of a crack check circuit located within a guard ring. The method may include comparing the frequency to a baseline frequency of oscillation of the crack check circuit. The current frequency and baseline frequency may be normalized using a set of bypass lines. The method may include determining there is a failure of the guard ring based on the difference between the normalized frequency of oscillation and the baseline normalized frequency of oscillation.

16 Claims, 6 Drawing Sheets

(56) References Cited

U.S. PATENT DOCUMENTS

| | | | |
|---|---|---|---|
| 2008/0185685 A1* | 8/2008 | Nakashiba | H01L 23/5223 257/535 |
| 2014/0191410 A1 | 7/2014 | Leatherman et al. | |
| 2014/0225624 A1* | 8/2014 | Chakrabarty | G01R 31/2894 324/509 |
| 2015/0370938 A1* | 12/2015 | Kawa | G06F 30/367 716/119 |
| 2017/0256504 A1 | 9/2017 | Minami et al. | |
| 2017/0345773 A1* | 11/2017 | Baek | H01L 23/585 |
| 2018/0364303 A1* | 12/2018 | Werhane | H03L 7/0812 |

\* cited by examiner

GUARD RING MONITOR

BACKGROUND

The present invention relates to microelectronic chip testing, and more specifically, to determining microelectronic chip failure.

Guard rings are used in various places in semiconductor chip design to provide electrical isolation of circuit functions. Guard rings are used to prevent undesirable interaction between devices, circuits, sub-functions, and power domains. The guard ring prevents both current injection and potential perturbations that can lead to parasitic devices, noise, ESD failure, and latchup. Guard rings are placed wherever concerns of parasitic interaction, noise, ESD, or latchup can occur.

BRIEF SUMMARY

An embodiment of the invention may include a method for determining a failure in a guard ring of a chip. The method may include measuring a current frequency of oscillation of a crack check circuit located within a guard ring. The method may include comparing the current frequency of oscillation of the crack check circuit to a baseline frequency of oscillation of the crack check circuit. The method may include determining there is a failure of the guard ring based on the difference between the current frequency of oscillation and the previous frequency of oscillation.

An embodiment of the invention may include a method for determining a failure in a guard ring of a chip. The method may include measuring a bypass frequency of oscillation of a crack check circuit located within a guard ring. The method may include measuring a current frequency of oscillation of a crack check circuit located within a guard ring. The method may include creating a normalized frequency based on the current frequency and the bypass frequency. The method may include comparing the normalized frequency to a baseline normalized frequency of oscillation of the crack check circuit. The method may include determining there is a failure of the guard ring based on the difference between the normalized frequency of oscillation and the baseline normalized frequency of oscillation.

Another embodiment of the invention provides a semiconductor structure for detecting a failure in a guard ring. The semiconductor structure may include a semiconductor component located on the semiconductor chip. The semiconductor structure may include a guard ring located around the semiconductor component. The semiconductor structure may include a crack check circuit located between the semiconductor component and the guard ring.

DETAILED DESCRIPTION

Embodiments of the present invention will now be described in detail with reference to the accompanying Figures.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantially similar (and its derivatives such as, for example, about) denote a difference by a generally accepted engineering or manufacturing tolerance, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

Guard rings, or crack stops, are an important component included in the back end structure of a semiconductor chip. Guard rings function to isolate the components within them, from conditions existing outside of those structures. However, when guard rings fail, trouble shooting of the root causes of the failure may be difficult, as visual inspection may be cumbersome or impossible.

Failure of the guard ring may allow certain environmental contaminants (e.g. ions) to change the dielectric properties of the materials inside the guard ring when cracks form. For example, the dielectric constant of the insulator in a vertical natural capacitor may change, depending on the level of contamination present. When such capacitors are included in a ring oscillator, this difference may be inferred through a shift in frequency of the ring oscillator. By having multiple different capacitively coupled lines as part of these ring oscillators, it may enable a precise determination of where the failure of the guard ring occurred.

Figure 1A:
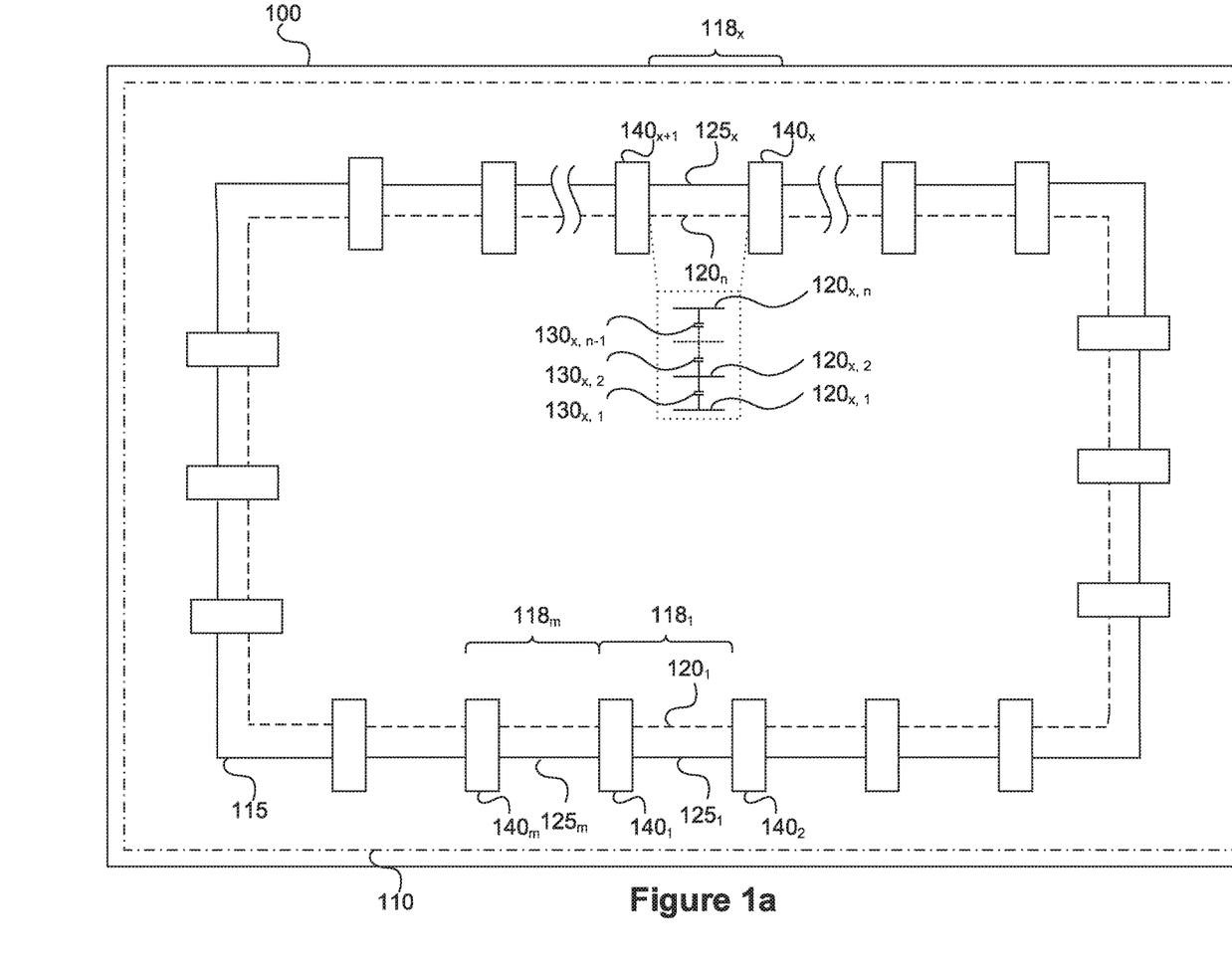
FIG. 1a illustrates an example layout of crack check wiring on a chip.

FIG. 1 illustrates an example layout of crack check wiring on a chip 100 for use in a crack check system 399 (FIG. 3), described herein. Chip 100 contains a guard ring 110, or crack stop line, located on the periphery of the chip 100. In other embodiments, guard ring 110 may surround, and isolate, any other structures located throughout the chip 100 that may require isolation from other areas of the chip.

Still referring to FIG. 1, a crack check circuit 115 may be located interior to the guard ring 110, and may be used to detect faults in the guard ring 110. The crack check circuit should be located as close as practical, or possible, to the guard ring 110, and distance. The crack check circuit 115 may be the first structure located interior to the guard ring 110. The crack check circuit may include a series of crack check circuit stage 118 (an individual stage may be denoted as crack check circuit stage $118_x$, such as crack check circuit stage $118_1$ and crack check circuit stage $118_m$, or briefly as circuit stage). Each crack check circuit stage 118 may contain a set of capacitively coupled lines $120_x$ (generally referred to as capacitively coupled lines 120, whereas each line in the set may be individually referred to as capacitively coupled line $120_{x,n}$), and bypass line $125_x$, located between a multiplexer/buffer junction $140_x$. Each crack check circuit stage 118 may correspond to a portion of the guard ring 110, and reference to a specific stage may be used throughout as reference to that portion of the guard ring 110. In the current embodiment, x may represent the stage number of the component, i.e. from 1 to m stages, while n represents the integrated circuit level of the capacitively coupled line $120_{x,n}$. Capacitively coupled lines 120 may be routed in such a way that 2 adjacent lines (e.g. capacitively coupled line $120_{1,1}$ and capacitively coupled line $120_{1,2}$) are capacitively coupled through a $V_N$, or vertical natural, capacitor $130_x$, . (e.g. capacitor $130_{1,2}$, generally referred to as capacitor 130). Further, the multiplexer/buffer junction 140 may be configured such that a buffer is located on the inlet and outlet of each pair of capacitively coupled lines 120, thereby creating an oscillating ring having a $V_N$ capacitor 130, . between capacitively coupled line $120_{x,n}$ and capacitively coupled line $120_{x,n+1}$ located in the x stage of the chip, at the n level of the chip, which may allow for measuring changes to the chemical structure of the capacitor 130 due to failure of the guard ring 110 in that stage of the chip 100. Bypass lines 125 may be located such that they are not impacted, or not substantially impacted, by other lines on the crack check circuit 115, and thus may act as a control, or baseline, for the crack check circuit 115.

Figure 2A:
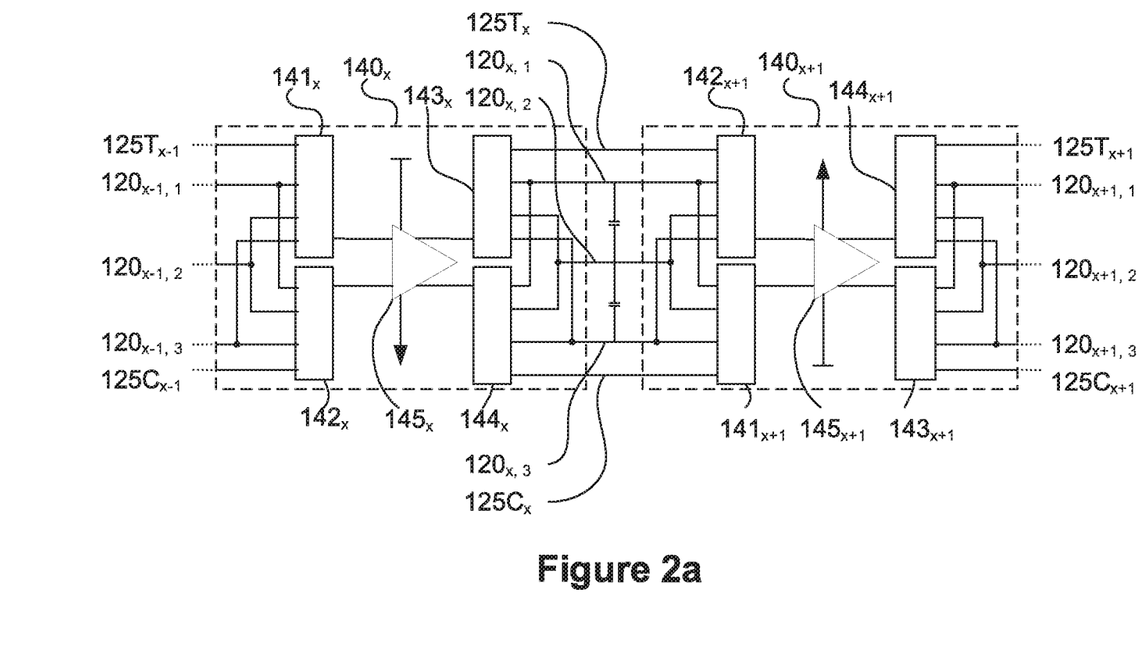
FIG. 2a illustrates an example wiring diagram depicting the components and wiring layout connecting multiplexer/buffer junctions.

FIG. 2a illustrates an example wiring diagram depicting the components and wiring layout connecting multiplexer/buffer junction $140_x$ and multiplexer/buffer junction $140_{x+1}$. In the example embodiment, the multiplexer/buffer junction $140_x$ may use a buffer $145_x$ having true and compliment lines. The multiplexer/buffer junction $140_x$ may use an inlet true multiplexer $141_x$ to select which incoming line from a previous stage of the crack check circuit 115 was previously selected, and will serve as the true inlet for the buffer $145_x$. The multiplexer/buffer junction $140_x$ may use an outlet true multiplexer $143_x$ to select which path the true signal will take to multiplexer/buffer junction $140_{x+1}$. The multiplexer/buffer junction $140_x$ may use an inlet complement multiplexer $142_x$ to select which incoming line from a previous stage of the crack check circuit 115 will serve as the complement inlet for the buffer $145_x$, based on which line was in use. The multiplexer/buffer junction $140_x$ may use an outlet complement multiplexer 144, to select which path the complement signal will take to multiplexer/buffer junction $140_{x+1}$. The true and complement of the buffer $145_{x+1}$ may be flipped (as depicted in the change of orientation of the hot and ground lines) leading to a rearrangement of inlet true multiplexer $141_{x+1}$, inlet complement multiplexer $142_{x+1}$, outlet true multiplexer $143_{x+1}$, and outlet complement multiplexer $144_{x+1}$ from that depicted in multiplexer/buffer junction $140_x$. This flipping of the buffer $145_{x+1}$ forms a ring oscillator circuit from each of the connected multiplexer/buffer junctions 140 around the inside of the guard ring 110. Outlet true multiplexer $143_x$ and outlet complement multiplexer $144_x$ may select a bypass path, through true bypass line $125T_x$ and through complement bypass line $125C_x$, respectively, or may route the signal through adjacent lines separated by a capacitive element, such as $120_{x,1}$ and $120_{x,2}$ separated by capacitor $130_{x,1}$. The adjacent lines may be able to detect a change in capacitance of the capacitor $130_{x,1}$, possibly due to the failure of guard ring 110 in the x stage and first level of the chip 100.

Alternatively, each stage of the ring oscillator may use single-ended buffers. Each stage of the ring would be a simple inverter stage, and each with the non-current carrying portion of the MIM going to ground. The differential ring, depicted in FIG. 2b, may be less vulnerable to common-mode noise.

Figure 2B:
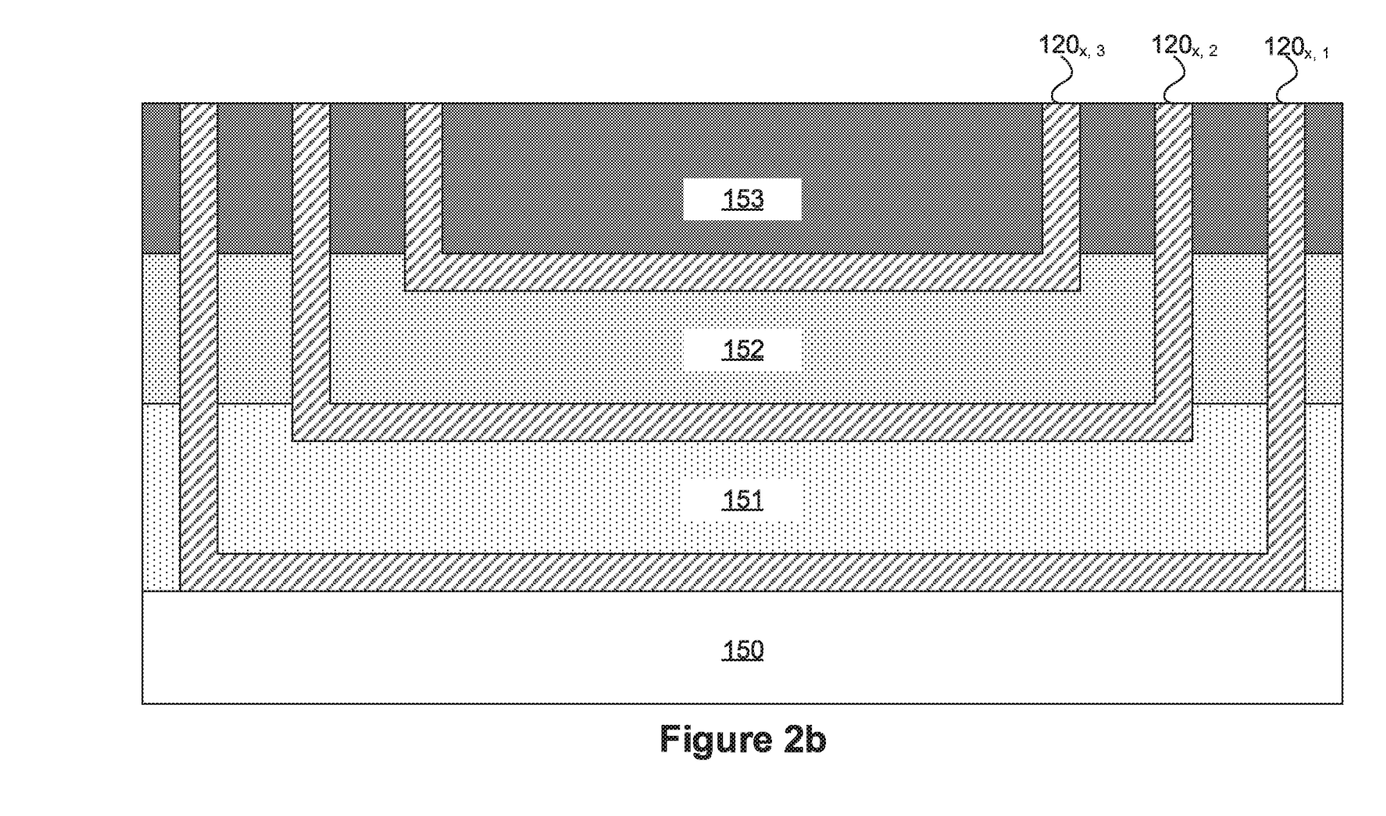
FIG. 2b illustrates a cross-sectional view of the structural routing of capacitively coupled lines.

FIG. 2b illustrates a cross-sectional view of the structural routing of capacitively coupled lines $120_{x,1}$, $120_{x,2}$, and $120_{x,3}$ of the wiring layout depicted in FIG. 2a. Capacitively coupled lines $120_{x,1}$, $120_{x,2}$, and $120_{x,3}$, (referred to together as "capacitively coupled lines 120") may be located between first dielectric layer 151, second dielectric layer 152, and third dielectric layer 153 (referred to together as "the dielectric layers"), above a semiconductor substrate 150, as depicted in FIG. 2b. Each pair of capacitively coupled lines 120 may form a metal-insulator-metal capacitor, which may be used as the vertical natural capacitor, or capacitor 130, in FIGS. 1 and 2a.

Still referring to FIG. 2b, the dielectric layers may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the dielectric layers. The dielectric layers may each have a thickness ranging from approximately 100 nm to approximately 150 nm and ranges there between, although a thickness less than 100 nm and greater than 150 nm may be acceptable.

Still referring to FIG. 2b, capacitively coupled lines 120 may be made of, for example, a typical line, via, and/or wire found in a typical interconnect structure. The capacitively coupled lines 120 may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed between the capacitively coupled lines 120 and the dielectric layers. In one embodiment, a liner may include, for example, a tantalum nitride layer, followed by a tantalum layer. Alternatively, the capacitively coupled lines 120 may include the various liners and barriers.

With continued reference to FIG. 2b, each dielectric layer may be deposited, and a trench defining the boundaries of a capacitively coupled line 120, and any vias connecting capacitively coupled lines 120 in layers below, may be formed using typical etching techniques, including, for example, a damascene process. The trench may be filled with a metal, thereby forming a capacitively coupled line 120, and the process may continue for each back end layer of the chip. Such processing may occur simultaneously for forming the crack stop, back end wiring, or any other suitable back end of the line process.

Figure 3:
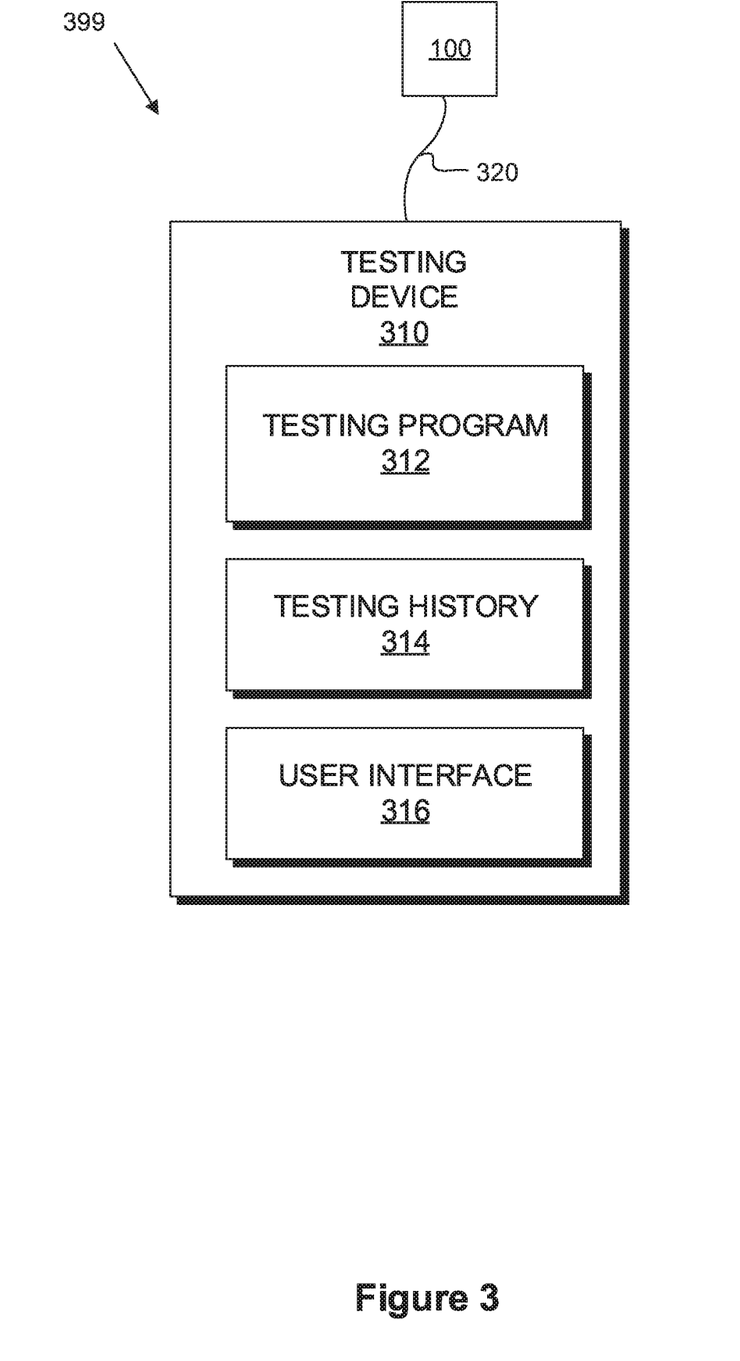
FIG. 3 illustrates a crack check system, in accordance with an embodiment of the invention.

FIG. 3 illustrates crack check system 399, in accordance with an embodiment of the invention. In an example embodiment, crack check system 399 includes a testing device 310 for connecting to chip 100.

Testing device 310 includes testing program 312, testing history 314 and user interface 316. In the example embodiment, testing device 310 is a desktop computer, a notebook or a laptop computer; however, in other embodiments, testing device 310 may be a smart phone, a tablet computer, a handheld device, a thin client, or any other electronic device or computing system capable of testing and analyzing the components of the chip 100. Testing device 310 may have a chip interface 320 capable of connecting to the multiplexer/buffer junctions 140 of chip 100, thereby enabling the testing device 310 to automatically select routing of each stage x and level n of chip 100 to check for a failure in the guard ring 110. Testing device 310 is described in more detail with reference to FIG. 5.

In the example embodiment, testing history 314 may contain information of previous tests conducted by testing device 310. In the example embodiment, testing history 314 may include test histories for the same chip 100, chips from the same batch as the chip 100, generalized data of progression of capacitance of other chips, or any other information that may apply to chip 100. Additionally, testing history 314 may contain generic information for all chips, such as statistical progression (average, standard deviations, etc.) of the ring oscillation frequency for a generic chip at different stages of its lifespan. Testing history 314 is described in further detail below with regard to FIG. 4.

User interface 316 includes components used to receive input from a user and transmit the input to an application residing on testing device 310. In an example embodiment, user interface 316 uses a combination of technologies and devices, such as device drivers, to provide a platform to enable users of testing device 310 to interact with testing program 312. In the example embodiment, user interface 316 receives input, such as textual input receive d from a physical input device, such as a keyboard, via a device driver that corresponds to the physical input device.

Testing program 312 is a software application or configuration in a software application capable of using the structures described in FIGS. 1, 2a, and 2b to determine whether noticeable damage has occurred to the chip 100. Testing program 312 may individually test each capacitively coupled pair of lines from capacitively coupled lines 120 to determine what section x and/or layer n of the chip experienced failure of the crack stop. The operations and functions of testing program 312 are described in further detail below with regard to FIG. 4.

Figure 4:
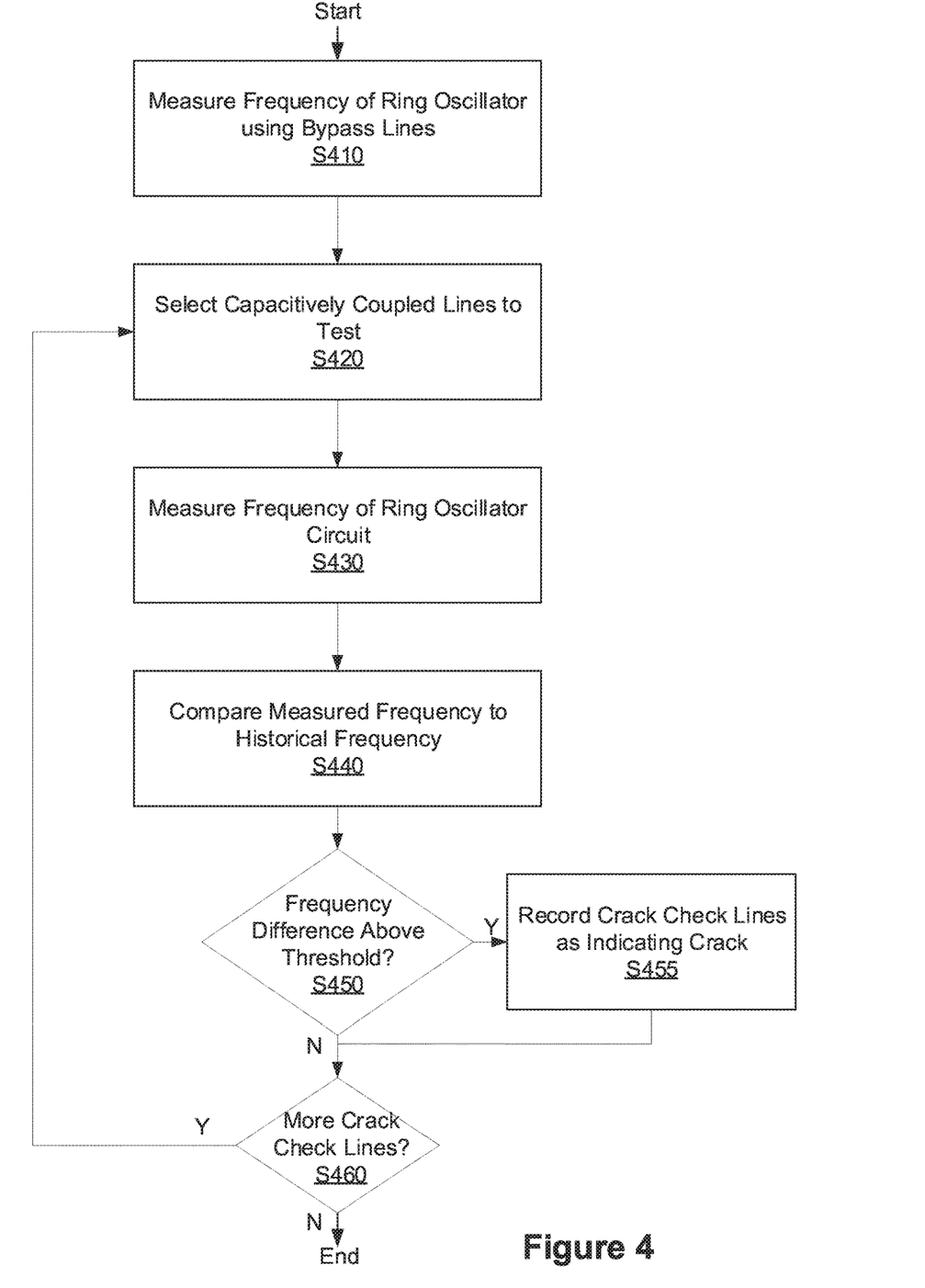
FIG. 4 is a flowchart illustrating the operations of the testing program of FIG. 3, in accordance with an embodiment of the invention.

FIG. 4 is a flow chart illustrating a method performed by the testing program 312 in determining damage to the crack stop line. Referring to step S410, testing program 312 enables a bypass route through the chip in order to determine a frequency of the bypass route, or bypass frequency. The bypass route may be selected to pass through every bypass line 125 (i.e. testing program selects bypass line $125_1$, bypass line $125_2$ ... and bypass line bypass line $125_m$). Such a route is not capacitively coupled to other lines, and may act as a control or baseline value for how the electrical connections, or buffers, may change during operation of the chip.

Referring to step S420, the testing program 312 selects a pair of capacitively coupled lines 120, such as capacitively coupled line $120_{x,\ y}$ and capacitively coupled lines $120_{x,\ y+1}$, to test. In such a test, the bypass lines 125 for all other stages of crack check circuit 115 would be selected in order to isolate the $V_N$ capacitor $130_{x,\ n}$ of the specific section x of crack check circuit 115, and determine the frequency of oscillation of the ring oscillator from the selected capacitively coupled lines.

Referring to step S430, the testing program 312 may introduce a current and measures the frequency of oscillation of the ring oscillator formed by the buffers in the selected pair of capacitively coupled lines 120, such as capacitively coupled line $120_{x,\ y}$ and capacitively coupled lines $120_{x,\ y+1}$. This frequency of oscillation may be recorded in testing history 314 for use in later analysis. For example, Referring to step S440, the testing program 312 may analyze the measured frequency to determine if damage to the guard ring 110 has occurred. In one embodiment, the difference between the measured frequency and the bypass frequency may be used to determine whether a crack exists. For example, if the absolute difference of the frequency is above a threshold, the guard ring 110 may be determined to be damaged. Additionally, if the percentage change from the baseline deviates from above an absolute percentage threshold, the guard ring 110 may be determined to be damaged. Such thresholds may be empirically determined from historical tests from testing history 314 with known damaged segments, or alternatively may be determined from segments through the chip, using segments that would be outside of a contamination zone for a crack in the current segment as a baseline. Such contamination zone may be based on the distance (e.g. level and portion distance) it takes for to see negligible effect from contamination due to a guard ring 110 crack, where the data for such determination may be located in testing history 314.

In another embodiment, a normalized frequency may be created by comparing the measured frequency to the bypass frequency. The normalized frequency may be the difference between the values, a ratio of the values, or any other mathematical comparisons that may enable a comparison that accounts for differences in buffers, bypass lines, or any other structures in the crack check circuit 115. The current normalized frequency may be compared to a historical normalized frequency of the chip, and may determine the guard ring 110 is damaged based on the difference being above/below a threshold value. In a different embodiment, the current normalized frequency may be compared to a historical trend of historical normalized frequencies, contained in testing history 314, for substantially similar chips and may determine the guard ring 110 is damaged based on the difference being above/below a threshold value.

Referring to step S450, the testing program 312 determines if the difference in the measured frequency and a historical frequency determined in step S440 is above a threshold value. If the difference is above the threshold value, testing program 312 proceeds to step S455. If the difference is below threshold value, testing program 312 proceeds to step S460.

Referring to step S455, the stage x and level n of the chip 100 that was determined as damaged may be recorded in testing history 314, or a notification may be sent to a user to signal failure of the guard ring 110 in this stage x and level n of the chip.

Referring to step S460, the testing program 312 determines if additional stages of the chip need to be tested. In one example embodiment, the testing program 312 may iteratively test every level n of each stage x, resulting in m*(n−1) tests for the entire chip. In other embodiments, testing program 312 may only test a sample of all of the routes. For example, testing program may test every other capacitor, or may focus on specific levels or place that are predictive of guard ring failure. If additional tests are not necessary, testing program 312 ends the test. If additional tests are necessary, testing program 312 proceeds to step S420.

The above is a system having a ring oscillator circuit for monitoring the health of a guard ring, wherein each ring oscillator stage contains a vertical natural capacitor that is sensitive to contamination ingress, and the frequency of the ring oscillator will change with the level of contamination. Specifically, the circuit ring oscillator is constructed using multiple buffer stages (see FIG. 1). The buffers are placed around the outside edge of the chip, equally spaced, and may be as close to guard ring, and thus the chip edge in this example, as possible. The component that connects one level to the next are constructed out of a MIM capacitor that is suitable for detecting contaminants/moisture/etc. (see FIG. 2b). The MIM runs the whole length from one buffer to the next, parallel and close to the guard ring. The metal levels used to form the plates of the MIM are selectable. For example, a multiplexer may select one MIM constructed on M1-M2 level, or another on M2-M3, or another M1-M4, or another that is just a wire (no MIM).

Figure 5:
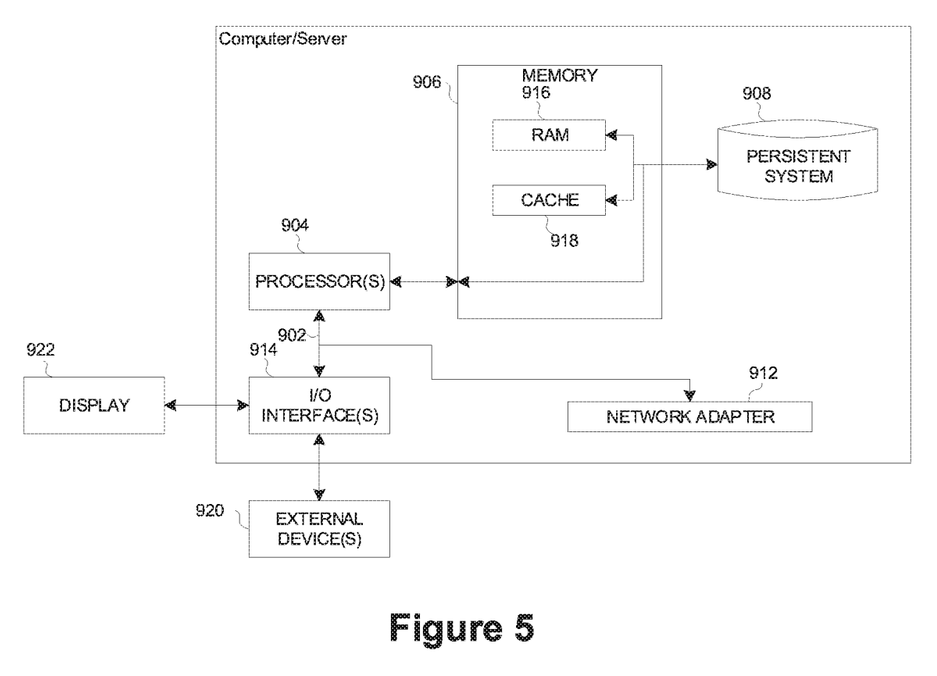
FIG. 5 is a block diagram depicting the hardware components of the crack check system of FIG. 3, in accordance with an embodiment of the invention.

FIG. 5 depicts a block diagram of components of testing device 310 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Testing device 310 include communications fabric 902, which provides communications between computer processor(s) 904, memory 906, persistent system 908, network adapter 912, and input/output (I/O) interface(s) 914. Communications fabric 902 can be implemented with any architecture designed for passing data and/or control information between processors (such as microprocessors, communications and network processors, etc.), system memory, peripheral devices, and any other hardware components within a system. For example, communications fabric 902 can be implemented with one or more buses.

Memory 906 and persistent system 908 are computer-readable storage media. In this embodiment, memory 906 includes random access memory (RAM) 916 and cache memory 918. In general, memory 906 can include any suitable volatile or non-volatile computer-readable storage media.

The testing program 312, testing history 314, and user interface 316 in testing device 310 are stored in persistent system 908 for execution by one or more of the respective computer processors 904 via one or more memories of memory 906. In this embodiment, persistent system 908 includes a magnetic hard disk drive. Alternatively, or in addition to a magnetic hard disk drive, persistent system 908 can include a solid state hard drive, a semiconductor storage device, read-only memory (ROM), erasable programmable read-only memory (EPROM), flash memory, or any other computer-readable storage media that is capable of storing program instructions or digital information.

The media used by persistent system 908 may also be removable. For example, a removable hard drive may be used for persistent system 908. Other examples include optical and magnetic disks, thumb drives, and smart cards that are inserted into a drive for transfer onto another computer-readable storage medium that is also part of persistent system 908.

Network adapter 912, in these examples, provides for communications with other data processing systems or devices. In these examples, network adapter 912 includes one or more network interface cards. Network adapter 912 may provide communications through the use of either or both physical and wireless communications links. The programs testing program 312, testing history 314, and user interface 316 in testing device 310 may be downloaded to persistent system 908 through network adapter 912.

I/O interface(s) 914 allows for input and output of data with other devices that may be connected to testing device 310. For example, I/O interface 914 may provide a connection to external devices 920 such as a keyboard, keypad, a touch screen, and/or some other suitable input device. External devices 920 can also include portable computer-readable storage media such as, for example, thumb drives, portable optical or magnetic disks, and memory cards. Software and data used to practice embodiments of the present invention, e.g., The programs testing program 312, testing history 314, and user interface 316 in testing device 310 can be stored on such portable computer-readable storage media and can be loaded onto persistent system 908 via I/O interface(s) 914. I/O interface(s) 914 can also connect to a display 922.

Display 922 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While steps of the disclosed method and components of the disclosed systems and environments have been sequentially or serially identified using numbers and letters, such numbering or lettering is not an indication that such steps must be performed in the order recited, and is merely provided to facilitate clear referencing of the method's steps. Furthermore, steps of the method may be performed in parallel to perform their described functionality.

What is claimed is:

1. A method for determining a failure in a guard ring of a chip, the method comprising:
    measuring a current frequency of oscillation of a crack check circuit located within a guard ring, wherein the crack check circuit comprises a plurality of circuit stages, wherein each circuit stage comprises an entry buffer connected to an exit buffer through a multiplexer by a plurality of lines, wherein a capacitively coupled line of the plurality of lines is capacitively coupled to a second line, and wherein a bypass line of the plurality of lines directly connects the entry buffer to the exit buffer;
    comparing the current frequency of oscillation of the crack check circuit to a baseline frequency of oscillation of the crack check circuit; and
    based on the difference between the current frequency of oscillation and the baseline frequency of oscillation, determining there is a failure of the guard ring.

2. The method of claim 1, wherein the frequency of oscillation is determined by selecting a capacitively coupled line from one of the plurality of circuit stages and selecting the bypass line from the other stages of the plurality of stages.

3. The method of claim 2, wherein the baseline frequency of oscillation is a previous measurement of the selected capacitively coupled line.

4. The method of claim 2, wherein the baseline frequency of oscillation is a measurement of a second capacitively coupled line located in a different portion of the chip as the selected line.

5. The method of claim 2, wherein the baseline frequency of oscillation is a measurement of a second capacitively coupled line located in a different level of the chip as the selected line.

6. A method for determining a failure in a guard ring of a chip, the method comprising:
    measuring a bypass frequency of oscillation of a crack check circuit located within a guard ring;
    measuring a current frequency of oscillation of a crack check circuit located within a guard ring, wherein the crack check circuit comprises a plurality of circuit stages, wherein each circuit stage comprises an entry buffer connected to an exit buffer through a multiplexer by a plurality of lines, wherein a capacitively coupled line of the plurality of lines is capacitively coupled to a second line, and wherein a bypass line of the plurality of lines directly connects the entry buffer to the exit buffer;
    creating a normalized frequency based on the current frequency and the bypass frequency;
    comparing the normalized frequency to a baseline normalized frequency of oscillation of the crack check circuit; and
    based on the difference between the normalized frequency of oscillation and the baseline normalized frequency of oscillation, determining there is a failure of the guard ring.

7. The method of claim 6, wherein the current frequency of oscillation is determined by selecting a capacitively coupled line from one of the plurality of circuit stages and selecting the bypass line from the other stages of the plurality of stages.

8. The method of claim 6, wherein the bypass frequency of oscillation is determined by selecting the bypass line from the all stages of the plurality of stages.

9. The method of claim 7, wherein the baseline frequency of oscillation is a measurement of a second capacitively coupled line located in a different portion of the chip as the selected line.

10. The method of claim 7, wherein the baseline frequency of oscillation is a measurement of a second capacitively coupled line located in a different level of the chip as the selected line.

11. A semiconductor chip comprising:
    a semiconductor component located on the semiconductor chip;
    a guard ring located around the semiconductor component;
    a crack check circuit located between the semiconductor component and the guard ring, wherein the crack check circuit comprises a first circuit stage, wherein the first circuit stage comprises a first buffer and a second buffer connected by a first metal line, and wherein the first metal line is capacitively coupled to a second metal line.

12. The semiconductor chip of claim 11, wherein the first metal line is capacitively coupled to the second metal line by a metal-insulator-metal capacitor.

13. The semiconductor chip of claim 12, wherein the insulator of the metal-insulator-metal capacitor is affected by environmental contamination due to a failure in the guard ring.

14. The semiconductor chip of claim 11, wherein the second line is connected to ground.

15. The semiconductor chip of claim 11, wherein the second line connects the first buffer and the second buffer.

16. The semiconductor chip of claim 11, wherein the first circuit stage is one of a plurality of circuit stages, and wherein each of the plurality of circuit stages comprises an entry buffer connected through a multiplexer to an exit buffer by a plurality of lines, wherein a first of the plurality of lines is capacitively coupled to a second line, and wherein a bypass line of the plurality of lines is not impacted by other lines of the plurality of lines.

* * * * *